(12) United States Patent
Chen et al.

(10) Patent No.: US 7,096,412 B2
(45) Date of Patent: Aug. 22, 2006

(54) METHOD FOR ITERATIVE AND NON-ITERATIVE DATA DETECTION USING REDUCED-STATE SOFT-INPUT/SOFT-OUTPUT ALGORITHMS FOR COMPLEXITY REDUCTION

(75) Inventors: Xiaopeng Chen, Sunnyvale, CA (US); Keith M. Chugg, Burbank, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 391 days.

(21) Appl. No.: 09/882,283

(22) Filed: Jun. 14, 2001

(65) Prior Publication Data

US 2002/0071504 A1    Jun. 13, 2002

Related U.S. Application Data

(60) Provisional application No. 60/212,583, filed on Jun. 19, 2000.

(51) Int. Cl.
    *H03M 13/03* (2006.01)
(52) U.S. Cl. .................. 714/794; 714/795; 375/262
(58) Field of Classification Search ............... 714/794, 714/795; 375/262
    See application file for complete search history.

(56) References Cited

U.S. PATENT DOCUMENTS

| | | | |
|---|---|---|---|
| 4,888,779 A | 12/1989 | Karabed et al. | 371/43 |
| 5,432,821 A | 7/1995 | Polydoros et al. | 375/340 |
| 5,574,751 A | 11/1996 | Trelewicz | 375/265 |
| 6,128,765 A * | 10/2000 | Ross et al. | 714/786 |
| 6,145,114 A * | 11/2000 | Crozier et al. | 714/794 |
| 6,658,071 B1 * | 12/2003 | Cheng | 375/348 |

OTHER PUBLICATIONS

S. Benedetto, G. Montorsi, D. Divsalar and F. Pollara in "Soft-Output Decoding Algorithms in Iterative Decoding of Turbo Codes," The Telecommunications and Data Acquisition Progress Report, Jet Propulsion Laboratory, California Institute of Technology, vo.*

Mueller, S.H.; Gerstacker, W.H.; Huber, J.B.; Reduced-state soft-output trellis-equalization incorporating soft feedback, GLOBECOM '96, vol. 1, Nov. 18-22, 1996.*

(Continued)

*Primary Examiner*—Joseph Torres
(74) *Attorney, Agent, or Firm*—Townsend and Townsend and Crew LLP (57) ABSTRACT

In a digital information processing system wherein a model of a finite state machine (FSM) receiving a plurality of FSM inputs and producing a plurality of FSM outputs is represented by a reduced-state trellis and wherein the FSM inputs are defined on a base closed set of symbols, a novel method is presented for updating soft decision information on the FSM inputs into higher confidence information whereby (1) the soft decision information is inputted in a first index set, (2) a forward recursion is processed on the input soft decision information based on the reduced-state trellis representation to produce forward state metrics, (3) a backward recursion is processed on the input soft decision information based on the reduced-state trellis representation to produce backward state metrics, wherein the backward recursion is independent of the forward recursion and (4) the forward state metrics and the backward state metrics are operated on to produce the higher confidence information.

31 Claims, 5 Drawing Sheets

OTHER PUBLICATIONS

R.G. Gallager, "Low-Density Parity-Check Codes", IRE Transactions on Information Theory, 1962.

L.R. Bahl et al., "Optimal Decoding of Linear Codes for Minimizing Symbol Error Rate", IEEE Transactions on Information Theory, Mar. 1974.

S. Lin et al., "Error Control Coding: Fundamentals and Applications—3 Linear Block Codes", Prentice Hall, 1983.

D.J.C. Mackay et al., "Near Shannon limit performance of low density parity check codes", Electronic Letters, vol. 32, No. 18, Aug. 1996.

S.M. Aji et al., "The Generalized Distributive Law", IEEE Transactions on Information Theory, vol. 46, No. 2, Mar. 2000.

F.R. Kschischang et al., "Factor Graphs and the Sum-Product Algorithm", IEEE Transactions on Information Theory, vol. 47, No. 2, Feb. 2001.

T.J. Richardson et al., "Design of Capacity-Approaching Irregular Low-Density Parity-Check Codes", IEEE Transactions on Information Theory, vol. 47, No. 2, Feb. 2001.

M. Vedat Eyuboglu, et al., "Reduced-State Sequence Estimation with Set Partitioning and Decision Feedback", IEEE Transactions on Communications, vol. 36, No. 1, Jan. 1988.

Chen et al. "Reduced-State Soft-Input/Soft-Output Algorithms for Complexity Reduction in Iterative and Non-Iterative Data Detection" IEEE International Conference on Communication 2000, vol. 1. pp. 6-10.

* cited by examiner

METHOD FOR ITERATIVE AND NON-ITERATIVE DATA DETECTION USING REDUCED-STATE SOFT-INPUT/SOFT-OUTPUT ALGORITHMS FOR COMPLEXITY REDUCTION

STATEMENT AS TO RIGHTS TO INVENTIONS MADE UNDER FEDERALLY SPONSORED RESEARCH AND DEVELOPMENT

This work was supported by a U.S. Army SBIR contract issued by commander of the U.S. Army CECOM, AMSEL-ACCC-A-CF/EW Intelligence Contract No. DAAB07-98-C-K004.

CROSS-REFERENCE TO RELATED APPLICATIONS

Not applicable.

BACKGROUND OF THE INVENTION

Currently, there is great interest in soft-input/soft-output (SISO) algorithms due to the outstanding performance of iterative data detection. Like the Viterbi algorithm (VA), the SISO algorithm is derived for an embedded system that can be modeled as a finite state machine (FSM). However, instead of making hard decisions as does the VA, the SISO algorithm generates soft decisions, i.e., reliability measures, for the investigated data. A hard decision can be readily obtained by thresholding the soft information. The key notion carried with the soft information, also its main advantage over a hard decision, is that the soft information can be refined by some way (e.g., through iteration) to make a later hard decision more reliable. Thus, the SISO algorithm is especially well-suited for iterative data detection. Because of this advantage, SISO algorithms have been widely used in various application, such as decoding of (both serial and parallel) Turbo codes and other codes, near-capacity multi-user detection, near-optimal two-dimensional data detection, and the detection of TCM signals in fading channels.

The biggest obstacle facing a practical implementation of the SISO algorithm is probably its complexity. The complexity of a SISO algorithm grows exponentially with the memory length of the FSM, e.g., the number of taps in an inter-symbol interference (ISI) channel or the constraint length of a convolutional code. It is not difficult to imagine how the complexity of such an algorithm can quickly overwhelm even the most advanced signal processing hardware and software. For a fixed-interval minimum sequence metric (FI-MSM) SISO algorithm, its computational complexity is approximately twice that of the VA and the number of memory units required is proportional to the product of block length and the number of states of the FSM. For instance, when the FI-MSM algorithm is applied to a 10-tap ISI channel with QPSK signaling, its complexity is dominated by the number of the states of the FSM, which is the order of the modulation scheme raised to an exponential equal the number of taps minus one ($4^9$=262,144). This relatively simple example of a transmitter and channel thus presents an implementation nightmare, as the relevant signal processing system is asked to perform SISO computations based on 262,144 possible states, a task that is practically infeasible today for most applications.

Therefore, there is a need for a method of digital information processing for producing soft outputs based on soft inputs that offers a significant reduction in computational and memory complexity from the standard SISO algorithm but is still capable of excellent performance.

SUMMARY OF THE INVENTION

According to the invention, in a digital information processing system wherein a model of a finite state machine (FSM) receiving a plurality of FSM inputs and producing a plurality of FSM outputs is represented by a reduced-state trellis and wherein the FSM inputs are defined on a base set of symbols, a novel method is presented for updating soft decision information on the FSM inputs into higher confidence information whereby (1) the soft decision information is inputted in a first index set, (2) a forward recursion is processed on the input soft decision information based on the reduced-state trellis representation to produce forward state metrics, (3) a backward recursion is processed on the input soft decision information based on the reduced-state trellis representation to produce backward state metrics, wherein the backward recursion is independent of the forward recursion and (4) the forward state metrics and the backward state metrics are operated on to produce the higher confidence information.

In one embodiment, an a-posteriori probability (APP) RS-SISO algorithm is used. In another embodiment, a minimum sequence metric (MSM) RS-SISO algorithm is used that is computationally simpler than the APP RS-SISO algorithm.

Results of numerical simulations based on various contexts are also presented to illustrate the performance of the RS-SISO algorithm.

This invention finds particular application in improvement in the complexity and accuracy of data detection in digital signal processing systems. The invention will be better understood by reference to the following detailed description in connection with the accompanying drawings.

DESCRIPTION OF SPECIFIC EMBODIMENTS

Figure 1:
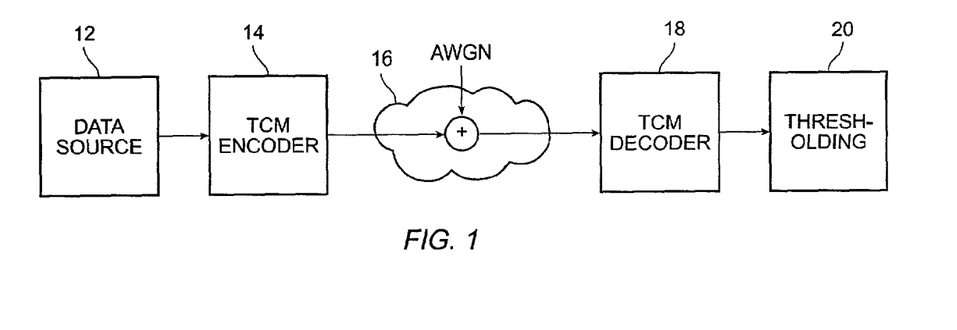
FIG. 1 shows a digital communication system employing a trellis coded modulation (TCM) encoder.

FIG. 1 shows a digital communication system 10 employing a trellis coded modulation (TCM) encoder 14. Such a TCM encoder 14 is just one of the many processes that can be modeled as a finite state machine (FSM). Other such processes include, but are not limited to, encoders based on Turbo codes or other codes, near-capacity multi-user detection, near-optimal two-dimensional data detection, fading channels, and inter-symbol interference (ISI) channels. Referring to FIG. 1, the digital communication system 10 includes a data source 12 providing symbols defined on a particular set of symbols. For example, if a binary set of symbols is used, the symbols are selected from $\{0, 1\}$. The symbols from the data source 12 are transferred to the TCM encoder 14, which converts the symbols into encoded symbols according to the structure of the TCM encoder 14. The encoded symbols are then sent through a channel 16, which can add noise, such as additive white Gaussian noise (AWGN), and distortions to the encoded symbol to produce an observed signal. Soft information relating to the observed signal is sent to a TCM decoder 18. The TCM decoder 18 outputs soft information regarding the symbols which can be thresholded to produce hard-decision decoded symbols. Since the operation of the TCM encoder 14 can be modeled as an FSM, the decoding function of the TCM decoder 18 can be based on the reduced-state soft-input/soft-output (RS-SISO) algorithm according to the invention as discussed below.

The digital communication system shown in FIG. 1 is a functional block diagram providing an illustrative example of basic functions. Different functions may be added or omitted. Also, application of the innovative methods discussed herein is not limited to this specific block diagram. Similarly, other block diagrams discussed below are merely illustrative examples and do not limit the applicability of the methods discussed herein.

Figure 2:
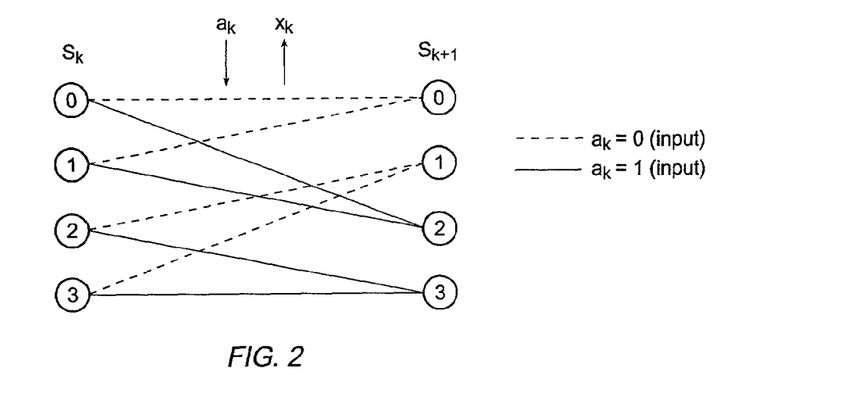
FIG. 2 shows a section of a trellis describing an FSM which models a process such as TCM encoding, ISI interference, and others.

FIG. 2 shows a section of a trellis describing an FSM which models a process such as TCM encoding, ISI interference, and others. Here, the trellis is a state diagram with explicit denotation of index in time, space, or some other dimension. Generally, such a trellis consists of a set of states $S=\{S_1, S_2, \ldots, S_N\}$. The state of the FSM at time k is $s_k=S_i \in S$. The trellis transition t is deterministically driven by a data source that outputs sequence $\{a_1, a_2, \ldots, a_K\}$ with symbol $a_k$ drawn from the M-ary set of symbols $A=\{A_0, A_1, \ldots, A_{M-1}\}$. Therefore, in an FSM, each transition t is associated with a starting state $s^s(t)$, an ending state $s^e(t)$, an input symbol a(t) and a output symbol x(t). For simplicity of presentation, only the FSM whose state is defined as $s_k=(a_{k-L}, a_{k-L+1}, \ldots, a_{k-1})$ is discussed here. However, one skilled in the art would realize that such a restriction is not necessary to the functionality of the FSM and related operations. An FSM whose state is defined as $s_k=(a_{k-L}, a_{k-L+1}, \ldots, a_{k-1})$ is said to have memory length L and the number of states $N=M^L$. Consequently, for a transition $t_k=$, $(a_{k-L}, \ldots, a_k)$, the relevant expressions are: $s^s(t_k)=(a_{k-L}, \ldots, a_{k-1})$, $S^e(t_k)=(a_{k-L+1}, \ldots, a_k)$, $a(t_k)=a_k$, and the output symbol $x_k=x(t_k)$. The function $x(\cdot)$ can be any mapping, such as a 1-to-1 mapping, an n-to-1 mapping, an n-to-m mapping, or some other mapping.

For clarity of illustration, FIG. 2 shows a section of a trellis for a relatively simple FSM with N=4 and M=2. Thus, the trellis consists of a set of states $S=\{0, 1, 2, 3\}$. The state of the FSM at time k is $s_k=S_i \in S$. The trellis transition t is deterministically driven by a data source that outputs sequence $\{a_1, a_2, \ldots, a_K\}$ with symbol $a_k$ drawn from the 2-ary set of symbols $A=\{0, 1\}$. In other words, the symbols are binary.

Besides the knowledge of the FSM structure, the SISO algorithm also requires some soft information as its input. The soft input is the sequence of reliability measures of the input symbol $a_k$ and the output symbol $x_k$. The two main kinds of soft information that are widely used are the probability distribution, such as $P(a_k)$ and $P(x_k)$, and its negative-log domain counterpart, such as metric $M(a_k)$ and metric $M(x_k)$. Note that the superscript i and o to be used with $P(\cdot)$ and $M(\cdot)$ denote "input" and "output", respectively. The resulting algorithms are referred to as the a-posteriori probability (APP) algorithm and the minimum sequence metric (MSM) algorithm, respectively. It is assumed that the knowledge of FSM structure and the a-priori soft information are perfectly known.

The following describes illustrative examples of the reduced-state soft-input/soft output (RS-SISO) algorithm. The RS-SISO algorithm achieves complexity reduction by a factor of $M^{L_2}$, when compared to the standard SISO algorithm. To implement the RS-SISO, the memory of the FSM is truncated and the corresponding trellis is rebuilt. The truncated state at time k is defined by $v_k=\{a_{k-L_1}, a_{k-L_1+1}, \ldots, a_{k-1}\}$, $a_k$ where $L_1 \leq L$ and $L_2=L-L_1$. If $L_1=L$, then $v_k=s_k$, and the RS-SISO algorithm becomes equivalent to the standard SISO algorithm. As in the SISO algorithm, the following state sets are defined:

$$F(j)=\{i:V_i \rightarrow V_j \text{ is an allowable forward transition}\} \quad (1)$$

$$B(i)=\{j:V_i \leftarrow V_j \text{ is an allowable backward transition}\} \quad (2)$$

$$C(m)=\{j:v_{k+1}=V_j, \text{ is consistent with } a_k=A_m\} \quad (3)$$

Figure 3:
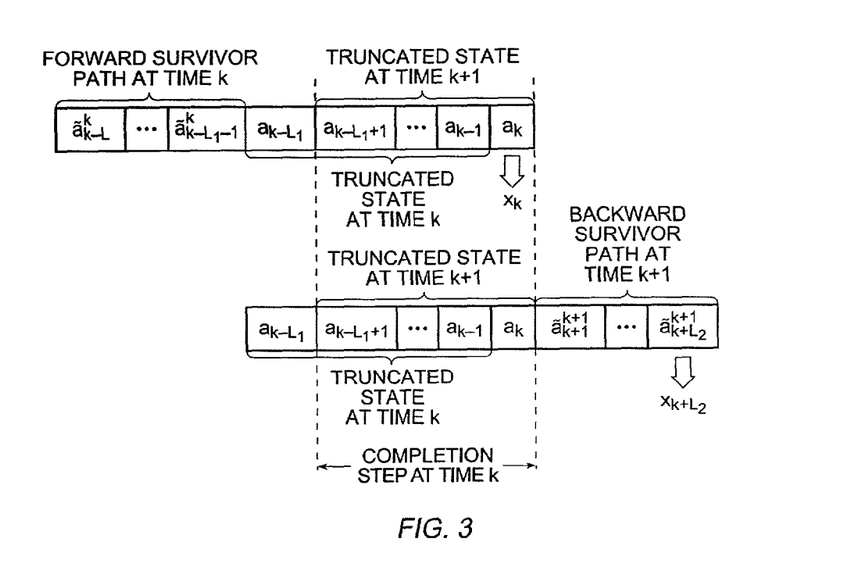
FIG. 3 illustrates the construction of the forward and backward transition and completion steps at time k in the RS-SISO algorithm.

FIG. 3 illustrates the construction of the forward and backward transition and completion steps at time k in the RS-SISO algorithm. The truncated state at time k is $v_k=\{a_{k-L_1}, a_{k-L_1+1}, \ldots, a_{k-1}\}$, and it is illustrated as being concatenated with a forward truncated survivor path. The truncated state at time k+1 is $v_{k+1}=\{a_{k-L_1+1}, a_{k-L_1+2}, \ldots, a_k\}$, and it is illustrated as being concatenated with a backward truncated survivor path.

In one embodiment, an a-posteriori probability (APP) RS-SISO algorithm is used. Here, forward and backward recursions can be calculated using the following recursively-defined quantities:

$$\alpha_k(j) = \sum_{i \in F(j)} \alpha_{k-1}(i) \gamma_k^f(i, j) \quad (4)$$

$$\beta_k(i) = \sum_{j \in B(i)} \beta_{k-1}(j) \gamma_{k+1}^b(i, j) \quad (5)$$

with initial values as $\alpha_0(i)=\Pr(v_0=V_i)$ and $\beta_K(j)=\Pr(v_k=V_j)$. For example, at time k=0, if the initial state of the FSM is $V_l$, then $\alpha_0(l)=1$, $\alpha_0(j)=0$, $j\neq l$. If no knowledge about $v_0$ is available, then $\alpha_0(i)=M^{-L_1}$.

Residual state information may be used in the forward and backward recursions in (4) and (5) by including information on forward and backward truncated survivor paths. Associated with each truncated state $v_k=V_i$, a truncated survivor path in the forward recursion can be obtained as $\tilde{a}_k^f(i) = \{\tilde{a}_{k-L}^k(i), \tilde{a}_{k-L_1+1}^k(i) \ldots, \tilde{a}_{k-L_1-1}^k(i)\}$, and a backward truncated survivor path can be obtained as $\tilde{a}_k^b(i) = \{\tilde{a}_k^k(i), _{k+1}^k(i), \ldots, \tilde{a}_{k+L_2-1}^k(i)\}$ (see FIG. 3). One reasonable way to obtain these truncated survivor paths is by defining, for a state at time k, the forward (or backward) survivor state as the state contributing most in the summation of (4) or (5). Other reasonable ways of obtaining truncated survivor path are also applicable. Based on the truncated survivor paths, the quantities associated with $t_k(i, j)=(v_k=V_i, v_{k+1}=V_j)$ in both the forward and backward recursion can be defined as (see FIG. 3):

$$\gamma_k^f(i,j)=P^i[x_k=x(\tilde{a}_k^f(i), t_k(i,j))]P^i[a_k(i,j)] \qquad (6)$$

$$\gamma_k^b(i,j)=P^i[x_{k+L_2}=x(t_k(i,j), \tilde{a}_{k+1}^b(j))]P^i[a_k(i,j)] \qquad (7)$$

where $a_k(i, j)$ is the value of the input symbol associated with a forward transition $V_i \to V_j$. When $L_2=0$, $\gamma_k^f(i,j)=\gamma_k^b(i,j)$, yielding the standard APP algorithm.

Note that each element of $\tilde{a}_k^f(i)$ and $\tilde{a}_k^b(i)$ is defined on the M-ary set of symbols $A=\{A_0, A_1, \ldots, A_{M-1}\}$. Alternatively, each element of $\tilde{a}_k^f(i)$ and $\tilde{a}_k^b(i)$ can be defined on some set partitioning of the M-ary set of symbols $A=\{A_0, A_1, \ldots, A_{M-1}\}$. For example, if M=8 and $A=\{A_0, A_1, \ldots, A_7\}$, elements of $\tilde{a}_k^f(i)$ and $\tilde{a}_k^b(i)$ may be defined on the set partitioning $D=\{D_0, D_1\}$, where $D_0$ encompasses $\{A_0, A_1, \ldots, A_3\}$ and $D_1$ encompasses $\{A_4, A_5, \ldots, A_7\}$. Other types of set partitioning are also possible.

The complexity of the forward and backward recursion in (4) and (5) is primarily determined by the number of states, i.e., $M^{L_1}$. Compared to the standard APP-SISO algorithm, the complexity of proposed APP RS-SISO is reduced by $M^{L_2}$ times. As illustrative examples, two types of soft output can be obtained as:

$$P^o(a_k = A_m) = \sum_{j \in C(m)} \alpha_k(j)\beta_k(j) \qquad (8)$$

$$P_e^o(a_k = A_m) = cP^o(a_k = A_m)/P^i(a_k = A_m) \qquad (9)$$

where c is a normalization constant. Due to the truncation of states, $P^o(x_k)$ cannot be yielded directly as in the standard SISO algorithm. However, $P^o(x_k)$ can still be obtained approximately. One simple way is to use the following definition:

$$P_e^o(x_k = x(t_k)) = \prod_{l=k-L}^{k} P_e^o(a_{l:t_k}) \qquad (10)$$

which can work fairly well. It is notable that (10) can be calculated recursively due to the temporal relationship between $t_k$ and $t_{k+1}$. $P_e^o(\cdot)$ can be viewed as the (approximate) a-posteriori probability normalized to the a-priori probability and is usually referred to as "extrinsic" information. If further iteration is necessary, $P_e^o(\cdot)$ can be used as feedback. Otherwise, the hard decision may be made by the rule: $\hat{a}_k=A_m$ if $P^o(a_k=A_m)\geq P^o(a_k=A_j)$ for all $0\leq j\leq M-1$. The completion step in (8) is also illustrated in FIG. 3.

The data detection performance of the RS-SISO algorithm is suboptimal when compared to the SISO algorithm, which is more complex in computation and memory. It can be observed that when the RS-SISO algorithm generates the soft output for $a_k$, the input information in time interval [k+1, k+$L_2$] has not been used. This further degrades performance. Self-iteration can be used to improve the performance of the RS-SISO algorithm. By feeding its soft-output back to its own soft-input port several times, the RS-SISO can fuse the information in the time interval [k+1, k+$L_2$] into the final soft output for $a_k$. Self-iteration can thus improve performance significantly.

The quantities $\alpha_K$ and $\beta_K$ are examples of forward state metrics and backward state metrics, respectively. Alternatively, the APP RS-SISO algorithm can be based on forward transition metrics and backward transition metrics, in addition to forward state metrics and backward state metrics. Furthermore, the operations used to obtain soft output information need not be limited to summation and multiplication, which is shown in (8) of the example discussed above. Such operations may also include summation, multiplication, minimum, maximum, minimum*, where minimum*(x, y)=minimum(x, y)−ln(1+e$^{-|x-y|}$), maximum*, where maximum*(x, y)=maximum(x, y)−ln(1+e$^{-|x-y|}$), linear weighting, exponentiation, combinations of the above, or others.

In another embodiment, a minimum sequence metric (MSM) RS-SISO algorithm is used. As in the APP RS-SISO algorithm, residual state information may be used in forward and backward recursions by including information on forward and backward truncated survivor paths. For example, in the case of an additive white Gaussian noise (AWGN), the negative-log domain counterparts to (6) and (7) can be defined as:

$$\lambda_k^f(i, j) = M^i[x_k = x(\tilde{a}_k^f(i), t_k(i, j))] + M^i[a_k(i, j)] \qquad (11)$$

$$\lambda_k^b(i, j) = M^i[x_{k+L_2} = x(t_k(i, j), \tilde{a}_{k+1}^b(j))] + M^i[a_k(i, j)] \qquad (12)$$

respectively, where the metric $M(w)=-\ln(P(w))$.

Note that each element of $\tilde{a}_k^f(i)$ and $\tilde{a}_k^b(i)$ is defined on the M-ary set of symbols $A=\{A_0, A_1, \ldots, A_{M-1}\}$. Alternatively, each element of $\tilde{a}_k^f(i)$ and $\tilde{a}_k^b(i)$ can be defined on some set partitioning of the M-ary set of symbols $A=\{A_0, A_1, \ldots, A_{M-1}\}$. For example, if M=8 and $A=\{A_0, A_1, \ldots, A_7\}$, elements of $\tilde{a}_k^f(i)$ and $\tilde{a}_k^b(i)$ may be defined on the set partitioning $D=\{D_0, D_1\}$, where $D_0$ encompasses $\{A_0, A_1, \ldots, A_3\}$ and $D_1$ encompasses $\{A_4, A_5, \ldots, A_7\}$. Other types of set partitioning are also possible.

The sequence metric associated with a symbol sequence $a_{k_1-L_1}^{k_2}$, or the equivalent state sequence $v_{k_1}^{k_2+1}$ can be defined as:

$$\Lambda^f(v_{k_1}^{k_2+1}) = \sum_{k=k_1}^{k_2} \lambda_k^f(i, j) \qquad (13)$$

-continued $$\Lambda^b(v_{kl}^{k2+1}) = \sum_{k=k_1}^{k2} \lambda_k^b(i, j) \quad (14)$$

and the key quantities for MSM RS-SISO are defined as:

$$\delta_k(j) = \min_{\substack{k+1: v_{k+1}=V_j \\ v_1}} \Lambda^f(v_1^{k+1}) \quad (15)$$

$$\eta_k(i) = \min_{\substack{k+1: v_{k+1}=V_i \\ v_1}} \Lambda^b(v_{k+1}^k) \quad (16)$$

consequently, the forward and backward recursion and the completion step of MSM RS-SISO can be expressed as:

$$\delta_{k+1}(j) = \min_{j \in F(j)} [\delta_k(i) + \lambda_{k+1}^f(i, j)] \quad (17)$$

$$\eta_k(i) = \min_{j \in B(i)} [\eta_{k+1}(j) + \lambda_{k+1}^b(i, j)] \quad (18)$$

$$M^0(a_k = A_m) = \min_{j \in C(m)} [\delta_k(j) + \eta_k(j)] \quad (19)$$

$$M_e^0(a_k = A_m) = M^0(a_k = A_m) - M^i(a_k = A_m) \quad (20)$$

$$M_e^0(x_k = x(t_k)) = \sum_{l=k-L}^{k} M_e^0(a_l : t_k) \quad (21)$$

Since the forward and backward recursion are similar to the recursion in the VA, the MSM RS-SISO can obtain the survivor paths used in (10) and (11) just as in the VA. Again, $M_e^\circ(\cdot)$ is fed back if further iterations are needed, and $M^\circ(a_k)$ is used to make the hard decision by the rule: $\hat{a}_k = A_m$ if $M^\circ(a_k = A_m) \leq M^\circ(a_k = A_j)$ for all $0 \leq j \leq M-1$.

Compared to the APP version, the MSM version only involves summation and comparison operations. Computationally, it is simpler than the APP version. However, the way the survivor path is defined in a log-APP algorithm must be specified (i.e., as discussed above). Numerical experiments have shown that the MSM SISO algorithm performs almost as well as its APP counterpart. Similarly, compared to the standard MSM algorithm, the complexity of MSM RS-SISO is also reduced by $M^{L_2}$ times.

The quantities $\delta_k$ and $\eta_k$ are examples of forward state metrics and backward state metrics, respectively. Alternatively, the MSM RS-SISO algorithm can be based on forward transition metrics and backward transition metrics, in addition to forward state metrics and backward state metrics. Furthermore, the operations used to obtain soft output information need not be limited to minimum and summation, as is shown in (19) of the example discussed above. Such operations may also include summation, multiplication, minimum, maximum, minimum*, where minimum*(x, y)=minimum(x, y)−ln(1+e^{−|x−y|}), maximum*, where maximum*(x, y)=maximum(x, y)−ln(1+e^{−|x−y|}), linear weighting, exponentiation, combinations of the above, or others.

Figure 4:
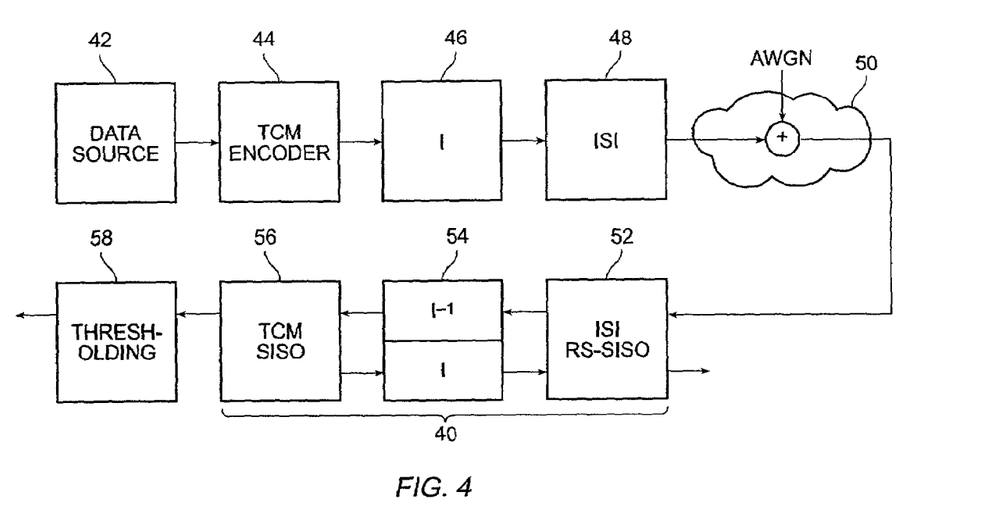
FIG. 4 shows a RS-SISO module within an iterative detection network.

FIG. 4 shows a RS-SISO module within an iterative detection network. An example of an iterative detection network 40 is shown. Here, a data source 42 is connected to a TCM encoder 44, which is connected to an interleaver 46, which is connected to an ISI channel 48. The output of the ISI channel is sent to the channel 50, where AWGN noise and/or distortion may be added. Although pictured separately, the ISI channel 48 maybe a part of the channel 50. An iterative detection network 40 consisting of SISO modules and soft information exchange rules and schedules receives the output of the channel 50. The iterative detection network 40 contains an ISI RS-SISO module 52 that has replaced a conventional ISI SISO module. It also contains an interleaver/deinterleaver 54 and a TCM SISO module 56. Soft information is circulated inside iterative detection network 40 several times before output is sent to a thresholder 58, where a hard decisions are made. Usually, the maximum number of iteration required to achieve a certain level of performance can be estimated numerically. For I iterations, the complexity of an iterative detection network employing a conventional SISO module, such as the conventional ISI SISO that has been replaced here, is proportional to $IM^L$. The RS-SISO algorithm is especially well-suited for use in an iterative detection network. By replacing the standard SISO module with an RS-SISO module, such as the ISI RS-SISO module 52, the complexity of the iterative detection network employing the RS-SISO algorithm is reduced by a factor of $IM^{l_2}$.

The following describes results of numerical simulations performed to test the performance of the RS-SISO algorithm.

Figure 5A:
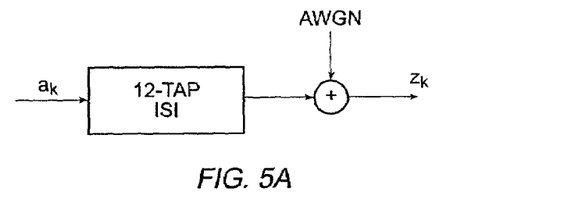
FIG. 5A shows an ISI/AWGN channel used test the performance of various detectors.
Figure 5B:
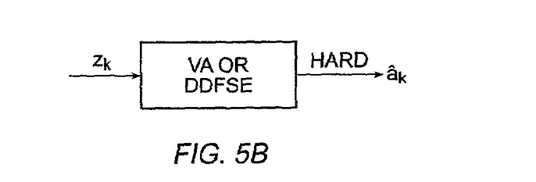
FIG. 5B shows a detector representing two hard decision algorithms, the VA and DDFSE.
Figure 5C:
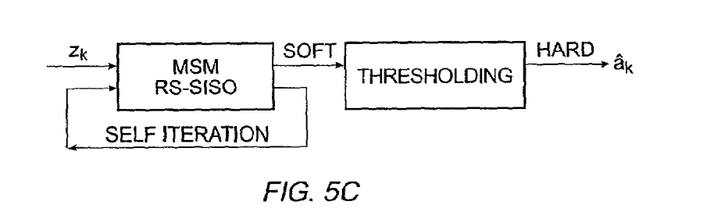
FIG. 5C shows a detector representing the MSM RS-SISO algorithm with self-iteration capability.

FIG. 5A shows an intersymbol interference, additive white Gaussian noise (ISI/AWGN) channel used to test the performance of various detectors. The structure of the ISI/AWGN channel is represented as a 12-tap (L=11) ISI block, along with components for adding AWGN. As to the taps of the ISI block, which is an FSM, Channel A has equal entries and Channel B has taps selected to be (c, 2c . . . , 12c). Both channels are normalized to have unit power. The transmitter uses a BPSK signaling scheme (i.e., $a_k = \pm\sqrt{E_b}$). The output of the ISI channel is then corrupted by an AWGN $n_k$ with $E\{n_k^2\} = N_o/2$. FIG. 5B shows a detector representing two hard decision algorithms, the VA and the delayed decision-feedback sequence estimation (DDFSE) algorithm, that are tested for purposes of comparison. Similar to the RS-SISO, truncated state of length $L_1$ is defined in the DDFSE. FIG. 5C shows a detector representing the MSM RS-SISO algorithm with self-iteration capability.

Figure 6:
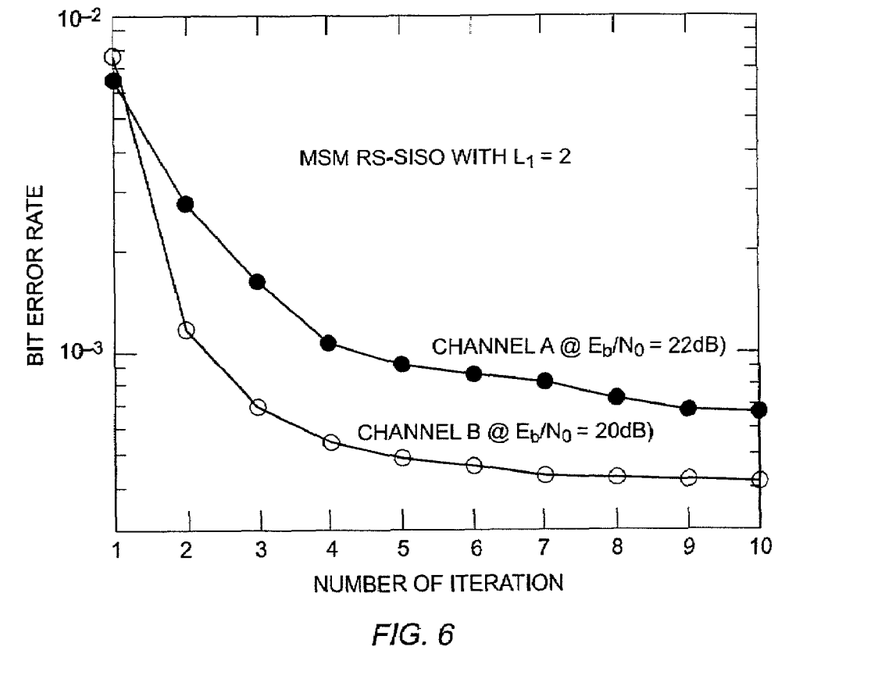
FIG. 6 illustrates the convergence properties of the detector shown in FIG. 5C in different ISI/AWGN channels.

FIG. 6 illustrates the convergence properties of the detector shown in FIG. 5C in different ISI/AWGN channels. The performance results shown here and below are obtained by numerical simulation. As seen in FIG. 6, convergence occurs after 4–5 iterations.

Figure 7:
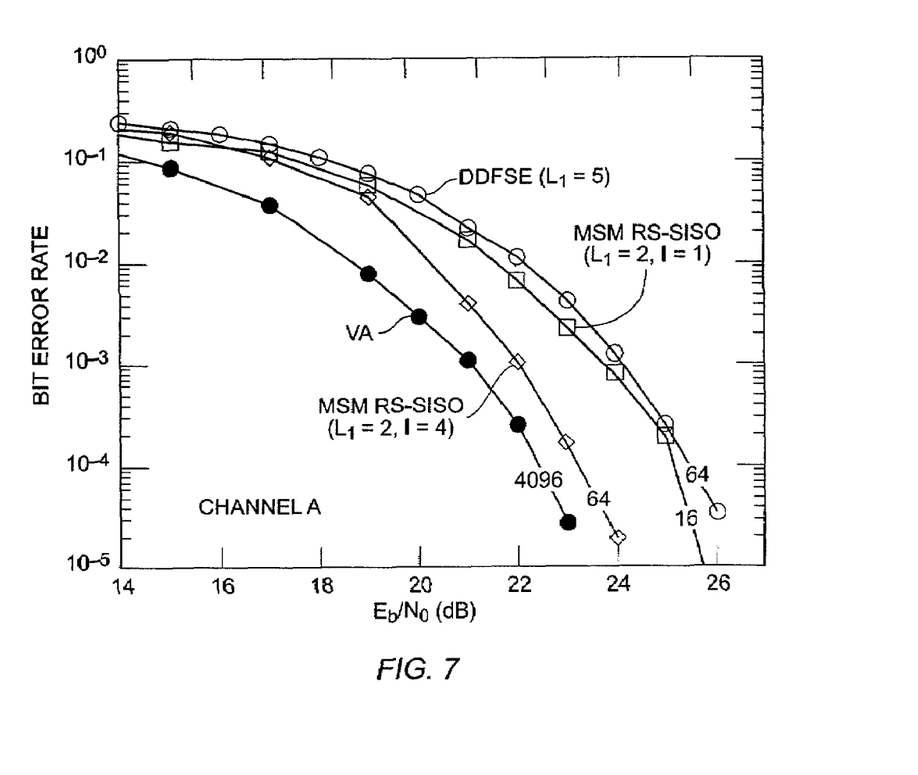
FIG. 7 compares the performance of the MSM RS-SISO algorithm with other algorithms in a minimum phase ISI/AWGN channel.

FIG. 7 compares the performance of the MSM RS-SISO algorithm with other algorithms in a minimum phase ISI/AWGN channel. An index of the computational complexity of the algorithm is defined as the product of the number of transitions $M^{L_1+1}$, the self-iteration number I and the recursion number r. Since the VA is forward-only, it has r=1. By contrast, the forward/backward SISO has r=2. In FIG. 7, as well as in FIGS. 8 and 9, this complexity index is shown for each algorithm used. The performance of the VA with $2^{11}=2,048$ states is presented as a baseline. First, it is noted that the DDFSE performs roughly 3 dB worse than the VA at a bit error rate (BER) of $10^{-4}$ when $L_1=5$, i.e., the DDFSE uses $2^5=32$ states. Without self-iteration, the MSM RS-SISO with $L_1=2$ performs only 0.3 dB better than the DDFSE. However, if self-iteration is used, after only 4 iterations, the performance of MSM RS-SISO is improved by 1.9 dB, and is only 0.8 dB away from that of the VA. The complexity index indicates that the RS-SISO is 64 times simpler than the VA with a performance degradation of less than 1 dB while it outperforms a DDFSE of similar complexity by 2.2 dB.

Figure 8:
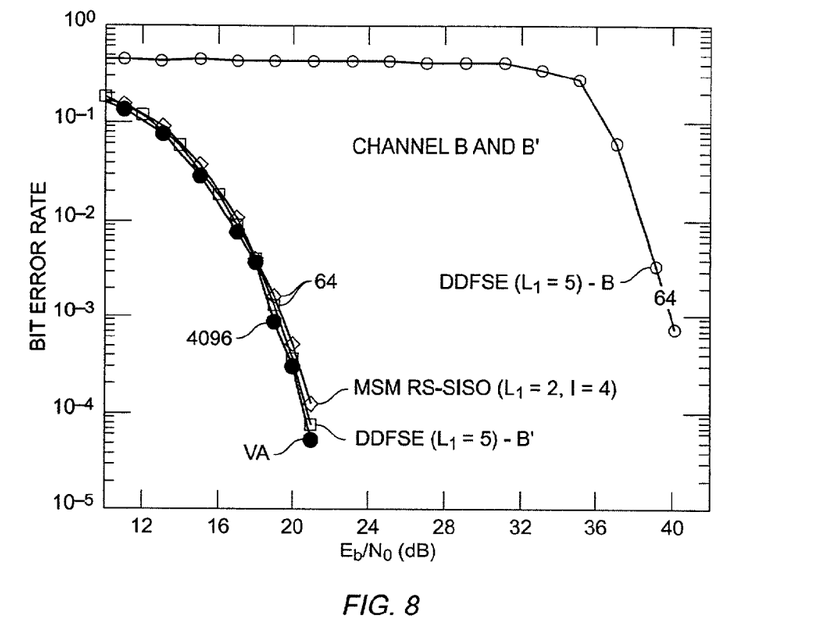
FIG. 8 compares the performance of the MSM RS-SISO algorithm with other algorithms in non-minimum phase ISI/AWGN channels.

FIG. 8 compares the performance of the MSM RS-SISO algorithm with other algorithms in non-minimum phase ISI/AWGN channels. Due to the bi-directional recursion of the RS-SISO algorithm (forward and backward recursions), its robustness to non-minimum phase channels is expected. By contrast, the DDFSE's non-symmetric structure (only a forward recursion is used) degrades its performance greatly when the channel is non-minimum phase. Channel B is such a channel, with taps of its ISI block selected to be (c, 2c..., 12c). Channel B' is defined as the time-reversed version of Channel B, that is, (12c, 11c..., c). The simulation results in FIG. 8 clearly show that the DDFSE with $L_1=5$ virtually fails for Channel B but works well for Channel B'. However, the iterative detector based on RS-SISO with the same complexity ($L_1=2$ and I=4) performs nearly optimally for both Channels B and B'.

Figure 9A:
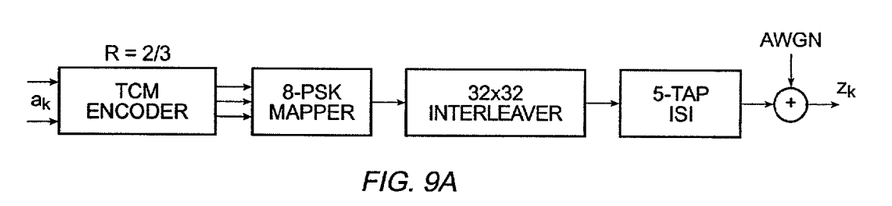
FIG. 9A shows a TCM/ISI/AWGN channel used test the performance of various detectors.

FIG. 9A shows a trellis code modulation, intersymbol interference, additive white Gaussian noise (TCM/ISI/AWGN) channel used to test the performance of various detectors. An 8-state, rate R=⅔ Ungerboeck 8-PSK TCM code is used in this test. The 8-PSK signals from the TCM encoder are fed into a 32×32 block interleaver. The interleaved 8-PSK signals pass through a 5-tap (L=4) ISI channel with equal entries (normalized to unit power), and the output is corrupted by a white complex circular Gaussian noise $n_k$ with $E\{|n_k|^2\}=N_o/2$.

Figure 9B:
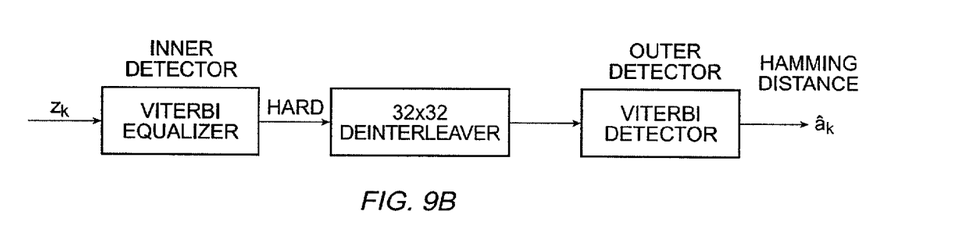
FIG. 9B shows the construction of a detector having the VA as both the inner and outer detector (VA-VA)
Figure 9C:
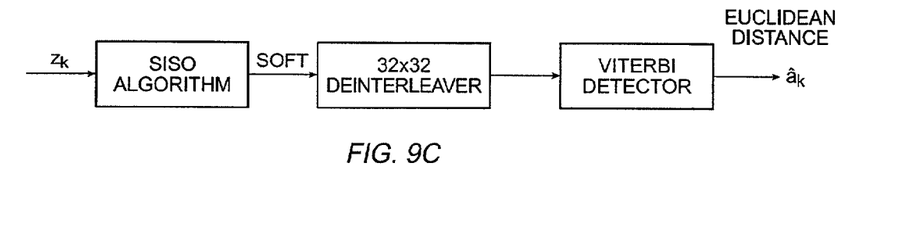
FIG. 9C shows the construction of a detector having an inner SISO module and an outer VA detector (MSM SISO-VA)
Figure 9D:
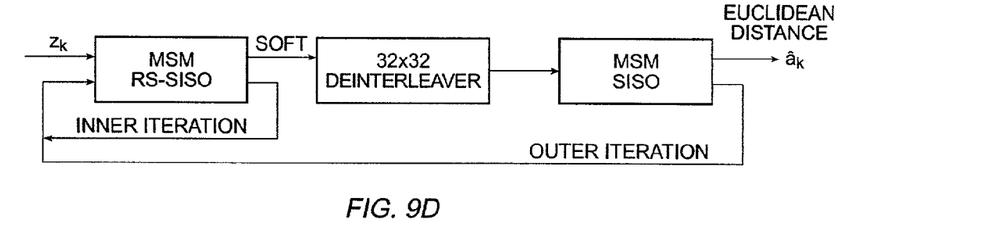
FIG. 9D shows the construction of a detector having an inner RS-SISO module and an outer SISO module and employing inner and outer iteration (MSM RS-SISO-SISO)

FIGS. 9B–9D show various detectors tested using the signal generated by the system shown in FIG. 9A. It is too complex to build a Viterbi detector by considering the concatenated TCM encoder and ISI channel as a single FSM. Alternatively, an iterative detection network may be used. That is, an effective approach is to build a "detector" (hard or soft) for each subsystem separately, such as an inner and an outer detector, and allow information to be processed iteratively and passed between the inner and the outer detector. FIG. 9B shows the contraction of a detector having the VA as both the inner and outer detector (VA-VA). One can use the VA as both the inner and outer detector, but poor performance is expected because the TCM code is decoded with hard decisions. FIG. 9C shows the construction of a detector having an inner SISO module and an outer VA detector (MSM SISO-VA). Here, the inner VA detector has been replaced by the SISO module, which can improve the overall performance since more reliable Euclidean distance is used at the outer VA detector.

Furthermore, by replacing the outer VA detector by a SISO module and using iterative detection, the overall performance can approach that of the optimal performance. However, even by treating the subsystems separately, the complexity of the inner detector is prohibitive. For example, in the above system, the inner FSM has $8^4=4,096$ states and $8^5=32,768$ transitions.

FIG. 9D shows the construction of a detector having an inner RS-SISO module and an outer SISO module and employing inner and outer iteration (MSM RS-SISO-SISO). Due to the sub-optimality of the RS-SISO algorithm and the concatenated detection structure, both the self-iteration of the inner RS-SISO module (also called inner iteration) and the outer iteration are used to increase the effectiveness of the detector. Therefore, besides the number of outer iterations $I_o$ associated with general iterative schemes, there is another design parameter for this specific detector: the number of the inner iterations $I_i$. Before feeding the soft information on the 8-PSK symbols to the outer SISO, the inner RS-SISO may conduct several inner iterations to improve the quality of the soft output. In this case, the complexity index is redefined as $M^{L_1+1}I_oI_i r$.

Figure 10:
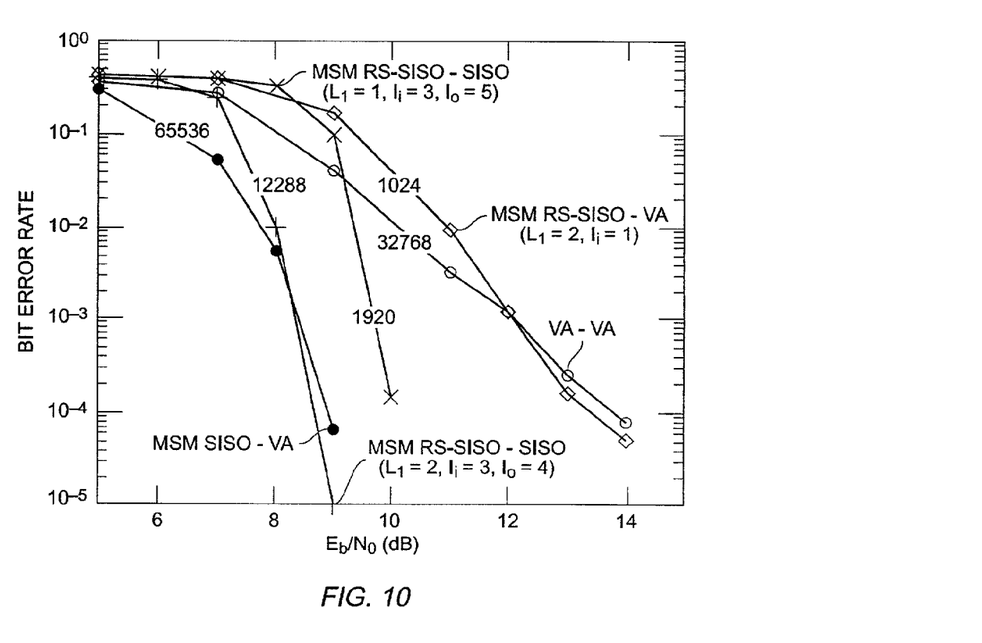
FIG. 10 shows the simulation results of the various detectors shown in FIGS. 9B–9D, along with other performance results.

FIG. 10 shows the simulation results of the various detectors shown in FIGS. 9B–9D, along with other performance results. There is a 5 dB gain in $E_b/N_o$ at a BER of $10^{-4}$ by replacing the VA with a MSM-SISO at the inner stage. This can be seen by comparing the results for MSM SISO-VA against the result for VA-VA. When replacing the inner VA by a MSM RS-SISO with $L_1=2$ ($I_i=1$), a 0.3 dB gain is obtained. This can be seen by comparing the results for MSM RS-SISO-VA against the results for VA-VA. In other words, without any performance degradation, the detector complexity is reduced by 32 times by simply using an RS-SISO algorithm, without iterative detection.

Performance detectors that combine the RS-SISO algorithm with iterative detection is also illustrated. As a baseline, it is shown that there is a 5 dB gain in $E_b/N_o$ at a BER of $10^{-4}$ by replacing the VA with a MSM-SISO at the inner stage. This can be seen by comparing the results for MSM SISO-VA against the result for VA-VA. However, the complexity of the MSM SISO-VA scheme is prohibitive, as discussed above. By employing the RS-SISO algorithm together with iterative detection, complexity can be significantly reduced. Two such detectors, labeled as MSM RS-RISO-SISO, are tested. Both converge in only 4–5 iterations (results are not shown here). One detector uses an MSM RS-SISO with $L_1=1$ (8 states), and 3 inner iterations ($I_i=3$). The hard decisions are made after five outer iterations ($I_o=5$). Compared to the MSM SISO-VA scheme, the performance degradation is only 1.1 dB while the complexity saving is 34 times. In order to obtain better performance, the other detector uses $L_1=2$ and $I_i=3$. After four outer iterations ($I_o=4$), a 0.3 dB gain is obtained over the MSM SISO-VA scheme while the complexity saving is roughly 5 times. Note that in this application, any reduced complexity hard-decision processor (e.g., RSSE, DDFSE) will perform worse than the VA-VA scheme in FIG. 10.

Thus, simulation results show that the RS-SISO algorithm provides significant reductions to complexity in very practical systems. The RS-SISO algorithm can be used in conjunction with iterative detection, including self-iteration, to provide additional reductions to complexity. Moreover, The results show that favorable tradeoffs between complexity and performance can be obtained by varying readily adjustable parameters within the algorithm.

The invention has been explained with reference to specific embodiments. Other embodiments will be evident to those of ordinary skill in the art. It is therefore not intended that this invention be limited, except as indicated by the appended claims.

What is claimed is:

1. A method for generating higher confidence information on data inputs of a process modeled as a finite state machine (FSM) represented by a reduced-state trellis, the FSM receiving a plurality of FSM inputs and producing a plurality of FSM outputs, the FSM inputs being defined on a base set of symbols, the method comprising:

(a) inputting said soft decision information in a first index set;

(b) performing forward recursion calculations on said reduced-state trellis representation using said input soft decision information and using a forward truncated survivor path comprising decisions not specified by the reduced-state trellis, to produce forward state metrics;

(c) performing backward recursion calculations on said reduced-state trellis representation using said input soft decision information and using a backward truncated survivor path comprising decisions not specified by the reduced-state trellis, the backward truncated survivor path being distinct from the forward truncated survivor path, to produce backward state metrics;

(d) operating on said forward state metrics and said backward state metrics to produce said higher confidence information; and (e) outputting said higher confidence information.

2. The method of claim 1, further comprising the steps of:

(f) modifying said input soft decision information using said output higher confidence information via a feedback path; and (g) repeating steps (a) to (f) until a termination condition is met.

3. The method of claim 1, wherein said operating comprises at least one of the following operations: summing, multiplication, minimum, maximum, minimum*, maximum*, linear weighting and exponentiation.

4. The method of claim 1, wherein the step of performing forward recursion calculations includes the steps of:

using residual state information to augment reduced-state trellis information to produce said forward state metrics; and updating said residual state information.

5. The method of claim 4, wherein said residual state information is a plurality of decisions on said FSM inputs.

6. The method of claim 5, wherein said decisions on said FSM inputs are defined on a revised set of symbols, wherein said revised set of symbols is a partitioning of said base set of symbols.

7. The method of claim 1, wherein the step of performing backward recursion calculations includes the steps of:

using residual state information to augment reduced-state trellis information to produce said backward state metrics; and updating said residual state information.

8. The method of claim 7, wherein said residual state information is a plurality of decisions on said FSM inputs.

9. The method of claim 8, wherein said decisions on said FSM inputs are defined on a revised set of symbols, wherein said revised set of symbols is a partitioning of said base set of symbols.

10. The method of claim 1, wherein the system is operative to perform at least one of the following functions:
    iterative detection;
    iterative decoding;
    turbo detection;
    turbo decoding;
    message passing; and
    belief propagation.

11. The method of claim 1, wherein said finite state machine is operative to model at least one of the following:
    a communication medium;
    a storage medium; and
    an imaging medium.

12. The method of claim 1, wherein said finite state machine is operative to model at least one of the following:
    allowable input and output pairs of a forward error correction code; and
    a forward error correction encoder.

13. The method of claim 1, wherein said finite state machine is operable to model a composite signal comprising at least one desired signal and at least one interference signal.

14. A method for generating higher confidence information on data inputs of a process modeled as a finite state machine (FSM) represented by a reduced-state trellis, the FSM receiving a plurality of FSM inputs and producing a plurality of FSM outputs, the FSM inputs being defined on a base set of symbols, the method comprising:

(a) inputting said soft decision information in a first index set;

(b) performing forward recursion calculations on said reduced-state trellis representation using said input soft decision information and using a forward truncated survivor path comprising decisions not specified by the reduced-state trellis, to produce forward state metrics and forward transition metrics;

(c) performing backward recursion calculations on said reduced-state trellis representation using said input soft decision information and using a backward truncated survivor path comprising decisions not specified by the reduced-state trellis, the backward truncated survivor path being distinct from the forward truncated survivor path, to produce backward state metrics and backward transition metrics;

(d) operating on said forward state metrics, said forward state transition metrics, said backward state metrics and said backward state transition metrics to produce said higher confidence information; and (e) outputting said higher confidence information.

15. The method of claim 14, further comprising the steps of:

(f) modifying said input soft decision information using said output higher confidence information via a feedback path; and (g) repeating steps (a) to (f) until a termination condition is met.

16. The method of claim 14, wherein said operating comprises at least one of the following operations: summing, multiplication, minimum, maximum, minimum*, maximum*, linear weighting and exponentiation.

17. The method of claim 14, wherein the step of performing forward recursion calculations includes the steps of:

using residual state information to augment reduced-state trellis information to produce said forward state metrics; and updating said residual state information.

18. The method of claim 17, wherein said residual state information is a plurality of decisions on said FSM inputs.

19. The method of claim 18, wherein said decisions on said FSM inputs are defined on a revised set of symbols, wherein said revised set of symbols is a partitioning of said base set of symbols.

20. The method of claim 14, wherein the step of performing backward recursion calculations includes the steps of:

using residual state information to augment reduced-state trellis information to produce said backward state metrics; and updating said residual state information.

21. The method of claim 20, wherein said residual state information is a plurality of decisions on said FSM inputs.

22. The method of claim 21, wherein said decisions on said FSM inputs are defined on a revised set of symbols, wherein said revised set of symbols is a partitioning of said base set of symbols.

23. The method of claim 14, wherein the system is operative to perform at least one of the following functions:
    iterative detection;
    iterative decoding;
    turbo detection;
    turbo decoding;
    message passing; and
    belief propagation.

24. The method of claim 14, wherein said finite state machine is operative to model at least one of the following:
a communication medium;
a storage medium; and
an imaging medium.

25. The method of claim 14, wherein said finite state machine is operative to model at least one of the following:
allowable input and output pairs of a forward error correction code; and
a forward error correction encoder.

26. The method of claim 14, wherein said finite state machine is operable to model a composite signal comprising at least one desired signal and at least one interference signal.

27. The method of claim 14, wherein the system is a system performing iterative detection, iterative decoding, turbo detection, turbo decoding, message passing, or belief propagation.

28. A system for generating higher confidence information on data inputs of a process modeled as a finite state machine (FSM) represented by a reduced-state trellis, the FSM receiving a plurality of FSM inputs and producing a plurality of FSM outputs, the FSM inputs being defined on a base set of symbols, the system comprising:
means for inputting said soft decision information in a first index set;
means for performing forward recursion calculations on said reduced-state trellis representation using said input soft decision information and using a forward truncated survivor path comprising decisions not specified by the reduced-state trellis, to produce forward state metrics;
means for performing backward recursion calculations on said reduced-state trellis representation using said input soft decision information and using a backward truncated survivor path comprising decisions not specified by the reduced-state trellis, the backward truncated survivor path being distinct from the forward truncated survivor path, to produce backward state metrics;
means for operating on said forward state metrics and said backward state metrics to produce said higher confidence information; and
means for outputting said higher confidence information.

29. A system for generating higher confidence information on data inputs of a process modeled as a finite state machine (FSM) represented by a reduced-state trellis, the FSM receiving a plurality of FSM inputs and producing a plurality of FSM outputs, the FSM inputs being defined on a base set of symbols, the system comprising:
means for inputting said soft decision information in a first index set;
means for performing forward recursion calculations on said reduced-state trellis representation using said input soft decision information and using a forward truncated survivor path comprising decisions not specified by the reduced-state trellis, to produce forward state metrics and forward state transition metrics;
means for performing backward recursion calculations on said reduced-state trellis representation using said input soft decision information and using a backward truncated survivor path comprising decisions not specified by the reduced-state trellis, the backward truncated survivor path being distinct from the forward truncated survivor path, to produce backward state metrics and backward state transition metrics;
means for operating on said forward state metrics, said forward state transition metrics, said backward state metrics and said backward state transition metrics to produce said higher confidence information; and
means for outputting said higher confidence information.

30. A device for generating higher confidence information on data inputs of a process modeled as a finite state machine (FSM) represented by a reduced-state trellis, the FSM receiving a plurality of FSM inputs and producing a plurality of FSM outputs, the FSM inputs being defined on a base set of symbols, the device comprising:
a plurality of device inputs for inputting said soft decision information in a first index set;
a plurality of processing units for performing forward recursion calculations on said reduced-state trellis representation using said input soft decision information and using a forward truncated survivor path comprising decisions not specified by the reduced-state trellis, to produce forward state metrics, performing backward recursion calculations on said reduced-state trellis representation using said input soft decision information and using a backward truncated survivor path comprising decisions not specified by the reduced-state trellis, the backward truncated survivor path being distinct from the forward truncated survivor path, to produce backward state metrics, and operating on said forward state metrics and said backward state metrics to produce said higher confidence information; and
a plurality of device outputs for outputting said higher confidence information.

31. A device for generating higher confidence information on data inputs of a process modeled as a finite state machine (FSM) represented by a reduced-state trellis, the FSM receiving a plurality of FSM inputs and producing a plurality of FSM outputs, the FSM inputs being defined on a base set of symbols, the device comprising:
a plurality of device inputs for inputting said soft decision information in a first index set;
a plurality of processing units for performing forward recursion calculations on said reduced-state trellis representation using said input soft decision information and using a forward truncated survivor path comprising decisions not specified by the reduced-state trellis, to produce forward state metrics and forward state transition metrics, performing backward recursion calculations on said reduced-state trellis representation using said input soft decision information and using a backward truncated survivor path comprising decisions not specified by the reduced-state trellis, the backward truncated survivor path being distinct from the forward truncated survivor path, to produce backward state metrics and backward state transition metrics, and operating on said forward state metrics, said forward state transition metrics, said backward state metrics and said backward state transition metrics to produce said higher confidence information; and
a plurality of device outputs for outputting said higher confidence information.

* * * * *